United States Patent [19]
Van Rooy

[11] Patent Number: 4,687,242
[45] Date of Patent: Aug. 18, 1987

[54] APPARATUS FOR HANDLING SEMICONDUCTOR WAFERS DURING FABRICATION OF INTEGRATED CIRCUITS

[76] Inventor: Dick Van Rooy, 3134 Bal Moral, San Jose, Calif. 95132

[21] Appl. No.: 735,182

[22] Filed: May 17, 1985

[51] Int. Cl.⁴ .................. B25B 11/00; B25J 15/06
[52] U.S. Cl. ........................ 294/64.1; 65/374.13
[58] Field of Search .............. 294/64.1–64.3, 294/99.2, 118, 902; 29/740, 743, 758; 65/374.13; 248/362, 363; 269/21; 279/3; 271/90

[56] References Cited

U.S. PATENT DOCUMENTS

| | | | |
|---|---|---|---|
| 3,272,350 | 9/1966 | Pflaumer et al. | 279/3 X |
| 3,404,973 | 10/1968 | Nedelec | 65/374.13 X |
| 3,533,771 | 10/1970 | Stehl et al. | 65/374.13 X |
| 3,655,233 | 4/1972 | Twist | 294/118 |
| 3,694,179 | 9/1972 | Deeg et al. | 65/374.13 X |
| 3,728,098 | 4/1973 | Giffen | 65/374.13 X |
| 4,496,180 | 1/1985 | Hillman et al. | 294/64.1 |

FOREIGN PATENT DOCUMENTS

| | | | |
|---|---|---|---|
| 2628488 | 1/1978 | Fed. Rep. of Germany | 294/64.1 |
| 2631502 | 1/1978 | Fed. Rep. of Germany | 294/64.1 |

OTHER PUBLICATIONS

IBM Technical Disclosure Bulletin, vol. 24, No. 6, Nov. 1981, "Vacuum Wafer Pick-Up Tip" by Ferrentino et al.

Primary Examiner—Johnny D. Cherry

[57] ABSTRACT

A semi-conductor wafer handling apparatus for use during fabrication of semi-conductor wafers, made of alumina and having a relieved flat face connected to a source of air pressure differential.

5 Claims, 2 Drawing Figures

APPARATUS FOR HANDLING SEMICONDUCTOR WAFERS DURING FABRICATION OF INTEGRATED CIRCUITS

BACKGROUND OF THE INVENTION

This invention relates to apparatus for handling objects by air pressure differential.

Semiconductor wafers are sliced from large crystals of semiconductor material and formed into a plurality of dice in a sequence of steps. During the processing of these wafers, they must be handled by the fabricators of the plant. One of the most convenient methods of handling wafers is by vacuum wands. These devices have a flat surface on a tip body to engage the wafer and means to apply a vacuum to an aperture in the flat surface. The tips are made of quartz, which is normally quite non-reactive and easy to fabricate. Quartz doesn't work well when the temperature of operation approaches its melting point. The tip can soften and can contaminate the wafer with silicon from the quartz. Since most wafer fabrication steps are done at high temperature, the use of quartz tips is a major problem.

Another problem inherent with quartz is that the tip must be physically thick. This limits the usefulness of the tips when a plurality of wafers are arrayed closely together. The wafers cannot be placed closer together than the tip is thick or only the end wafers can be processed.

SUMMARY OF THE INVENTION

This invention provides a semiconductor handling apparatus comprising:

A body member, made of a ceramic material, having a first planar surface with at least one aperture that is surrounded by said surface and means for connecting said apparatus to a means for generating an air pressure differential. The preferred ceramic is alumina. The shape of the front end of the tip forms a slender wedge that can enter between closely arrayed or stacked wafers.

DETAILED DESCRIPTION

Figure 1:
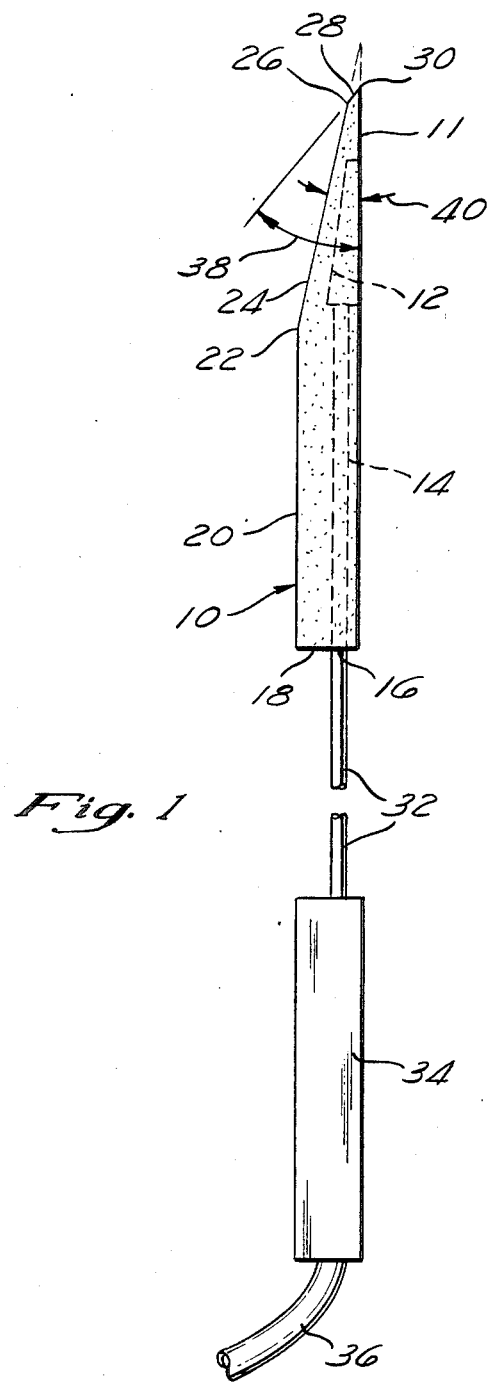
FIG. 1 is a side view of the tip of the present invention.

Referring now to FIG. 1, the body of the tip 10 has a planar surface 11, that will be hereinafter referred to as the top surface. This surface has an aperture 12 extending into the body. A means for allowing air to pass 14 connects the aperture at one end of the passage to the rear surface 18 of the body at the second end 16.

The body is comprised of several planar surfaces, including a second surface 20, that is parallel to the first surface, a third surface 24 that is angled at a sharp acute angle 40 compared to the first surface, and a fourth surface 28 that is angled at a less sharp angle 38 compared to the first surface. The second and third surfaces join at a first intersection 22 that is parallel to the rear surface of the body. The third and fourth form a second intersection 26 and the fourth and first surfaces form an intersection 30.

The tip of this invention has a leading angle 38 at the front of the tip allowing easy insertion into stacked wafers. The front angle 40 is blunter, to prevent undue wear to the leading edge, which is the third intersection 30.

In use the wafer lies on the first surface 11 and is held tightly by an air pressure differential generated by reduced air pressure in the aperture 12. The body is connected to means for reducing air pressure by a hollow rod 32 joined to the second end 16 of the air passageway 14. The rod may be mounted by any conventional airtight means, but permanent bonding by, for example, glue means is preferred.

A handle 34 allows the apparatus to be easily manipulated by an operator. The handle may have triggers for air pressure reduction, to engage wafers, and for air pressure increase to release the wafers. The air line 36 can be connected to any conventional air source.

Figure 2:
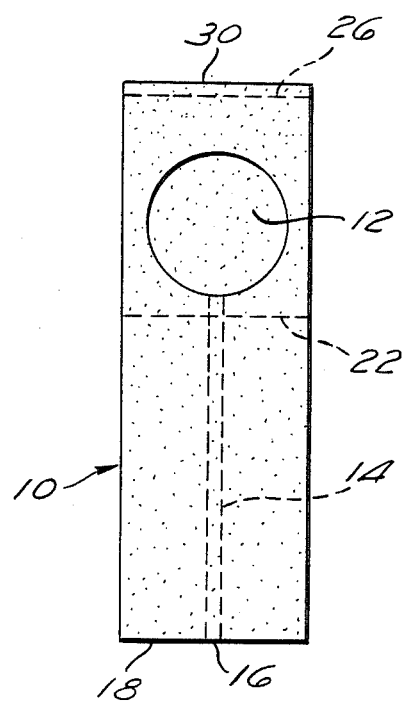
FIG. 2 is a top view as viewed from above the planar surface having the aperture.

Referring to FIG. 2, the body 10 has a circular aperture 12 mounted between the first intersection 22 and the second intersection 26 (or, equivalently, the third surface). The air passageway 14 extends lengthwise down the body. The second end 16 of the air passageway 14 is on the rear surface 18. The body can be mounted on an air pressure rod as shown in FIG. 1.

The body is thinner than conventional tips because it is made from ceramic, which is more easily molded. Any ceramic, alumina, silica, magnesia, titania, or mixtures such as alumina/silica or clays, such as kaolin, sepiolite, hallarpite or the like, whether natural or artificial can be used to advantage in this invention. The preferred ceramic is alumina. Alumina is refractory to melting at the temperatures used in wafer fabrication.

What is claimed is:

1. A semiconductor wafer handling apparatus comprising:
   a body member, made of molded alumina, said body member having;
   a first planar surface with a relief in said surface;
   a second planar surface parallel to the first planar surface,
   a rear planar surface at substantially right angles to said first and second planar surface forming a rear surface of the body member;
   a third planar surface angled at a sharp acute angle compared to the first surface and forming a first intersection with said second planar surface, the first intersection parallel to said rear surface and;
   a fourth planar surface angled at a less sharp acute angle compared to the first surface forming a second intersection with said third planar surface, the second intersection parallel to said rear surface, said fourth surface additionally forming a third intersection with said first surface, the third intersection parallel to said rear surface; and
   means for connecting said relief to means for generating air pressure differential.

2. The handling apparatus of claim 1 wherein said body member includes at least one air passageway between said relief and a rear surface of the body member.

3. The handling apparatus of claim 1 including a hollow rod, having a first end and a second end, and having said first end disposed in said means for connecting.

4. The handling apparatus of claim 3 wherein said rod is bonded to said means for connecting.

5. The handling apparatus of claim 3 wherein said second end is disposed in a manipulable handle suitable for human hands to comfortably grasp and move.

* * * * *